US007002413B2

(12) United States Patent
Tsunai (10) Patent No.: US 7,002,413 B2
(45) Date of Patent: Feb. 21, 2006

(54) VOLTAGE AMPLIFICATION CIRCUIT (75) Inventor: Shiro Tsunai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/691,682

(22) Filed: Oct. 22, 2003

(65) Prior Publication Data

US 2004/0104776 A1    Jun. 3, 2004

(30) Foreign Application Priority Data

Oct. 29, 2002   (JP)   ............................. 2002-314218

(51) Int. Cl.
*H03F 3/68* (2006.01)
(52) U.S. Cl. ...................... 330/310; 330/311
(58) Field of Classification Search ............... 330/277, 330/298, 310, 311; 327/256
See application file for complete search history.

(56) References Cited

U.S. PATENT DOCUMENTS 4,184,124 A * 1/1980 Asakawa .................... 330/264
5,745,009 A * 4/1998 Leroux et al. ............... 330/277
5,966,172 A   10/1999 Tsunai ........................ 348/241

FOREIGN PATENT DOCUMENTS

JP          8-274559      10/1996
JP          2586393       12/1996

* cited by examiner

*Primary Examiner*—Steven J. Mottola
(74) *Attorney, Agent, or Firm*—Scully, Scott, Murphy & Presser (57) ABSTRACT

A voltage amplification circuit is provided which is capable of faithfully amplifying an input signal even in an inverting amplifier placed in a second stage being DC-coupled to an inverting amplifier placed in a first stage. By DC-coupling the inverting amplifiers and by setting an amplifying operation starting input voltage in the inverting amplifier placed in the first stage to be lower than that in the inverting amplifier placed in the second stage, the voltage amplification circuit that can provide a large amplification factor is realized. By configuring so that a circuit to set a clamping voltage has substantially the same configurations as a circuit to set an amplifying operation starting input voltage in the inverting amplifier placed in the second stage, the voltage amplification circuit is obtained that can follow variations in parameters on manufacturing and provide a wide operating margin and operate in a stable manner even though variations in parameters on manufacturing or variations in a source voltage occur.

8 Claims, 9 Drawing Sheets

VOLTAGE AMPLIFICATION CIRCUIT

BACKGROUND OF THE INVENTION

1. Field of the Invention

The present invention relates to a VOLTAGE AMPLIFICATION CIRCUIT and more particularly to the voltage amplification circuit constructed by DC (Direct Current) coupling a plurality of inverting amplifiers.

The present application claims priority of Japanese Patent Application No. 2002-314218 filed on Oct. 29, 2002, which is hereby incorporated by reference.

2. Description of the Related Art

In this kind of voltage amplification circuit, in order to increase a voltage amplification factor, it is preferable that multistage amplifiers are DC-coupled to one another. A conventional voltage amplification circuit of this type is described by referring to FIGS. 8 and 9.

Figure 8:
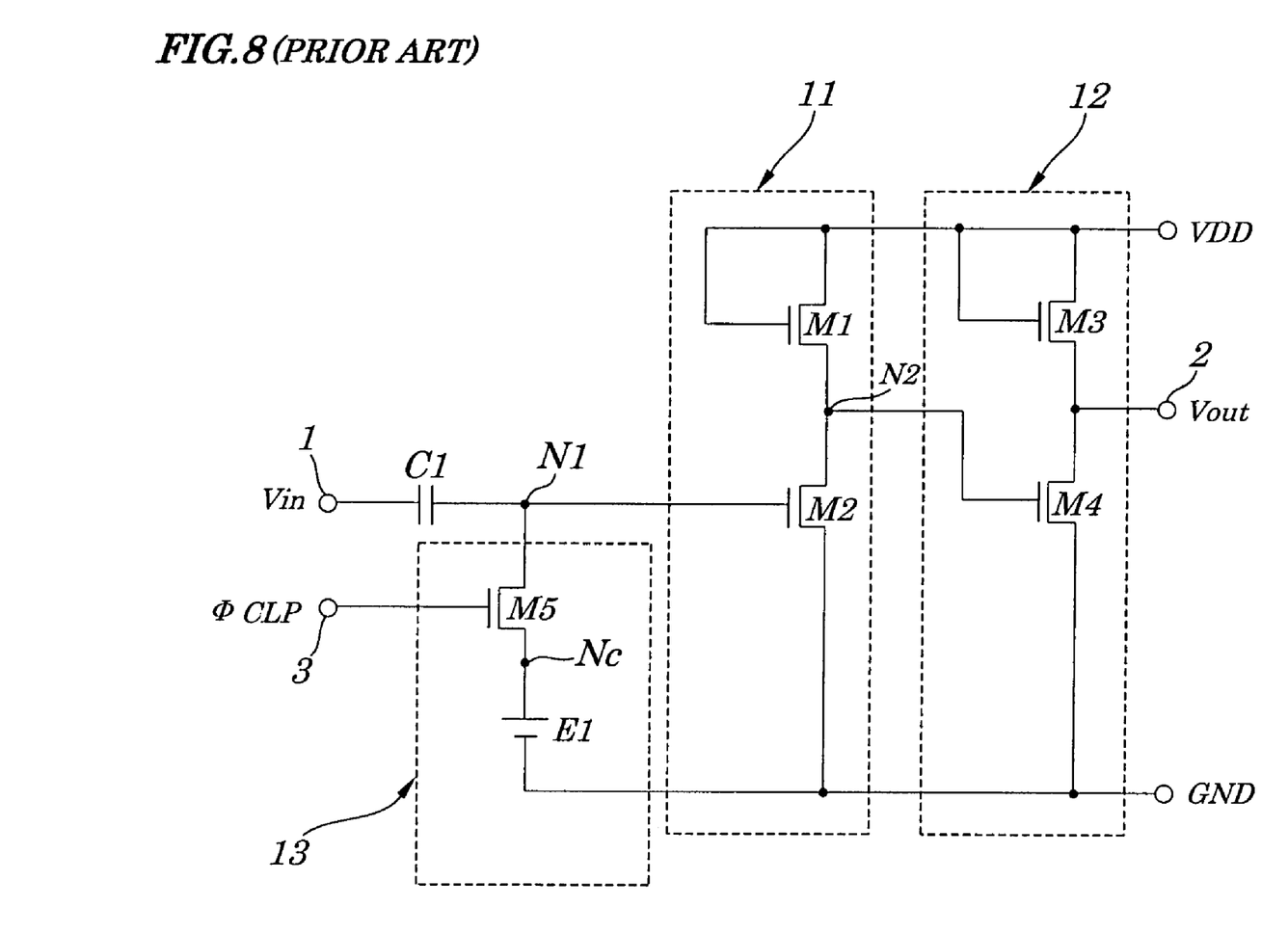
FIG. 8 is a circuit diagram showing configurations of a conventional voltage amplification circuit.

The conventional voltage amplification circuit shown in FIG. 8 includes a signal input terminal 1, a clamping capacitor C1, inverting amplifiers 11 and 12 both being DC-coupled to each other and both having the same characteristics, a signal output terminal 2, and a clamping circuit 13. Input signal Vin shows a signal to be input to the signal input terminal 1. The clamping capacitor C1 interrupts a DC component from an external to the conventional voltage amplification circuit, that is, blocks a DC component contained in the input signal Vin and transfers only an AC (Alternating Current) component contained in the input signal Vin to an input node N1. The inverting amplifier 11 amplifies an input voltage V1 at the input node N1 and outputs the amplified voltage to the inverting amplifier 12. The inverting amplifier 12 amplifies an output voltage V2 at an output node N2 of the inverting amplifier 11 and outputs the amplified voltage as an output signal Vout to signal output terminal 2. While a control signal φ CLP fed to a control signal terminal 3 in the clamping circuit 13 is active, a switching transistor M5 in the clamping circuit 13 is turned ON, causing a voltage at a clamping voltage source E1 to be fed to the input node N1 as a clamping voltage Vc for DC biasing. While the control signal φ CLP is inactive, the switching transistor M5 is turned OFF and the input signal Vin is input and an amplifying operation is started. The control signal φ CLP is a control signal which becomes active at specified intervals.

Figure 9:
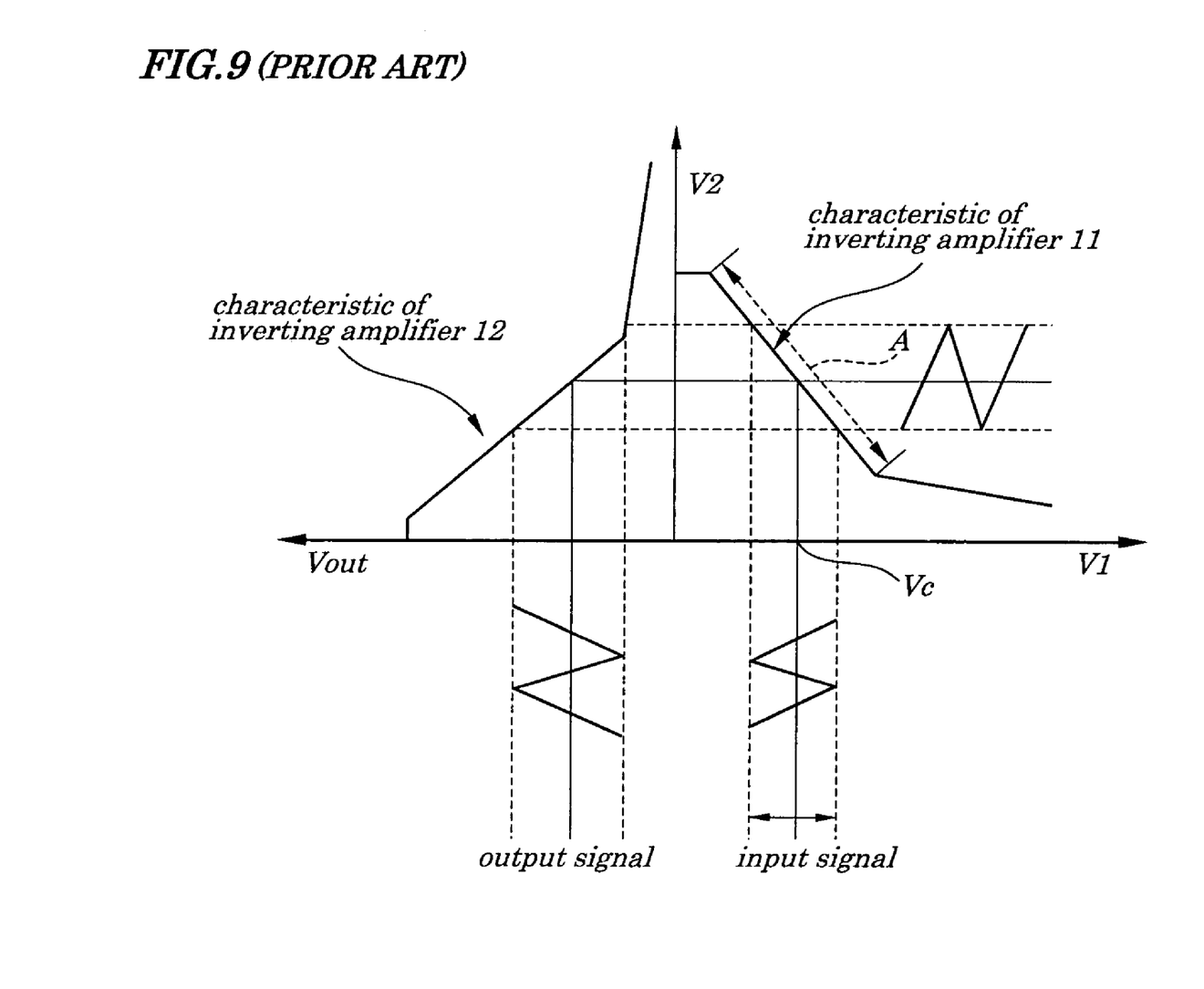
FIG. 9 is a diagram illustrating input and output characteristics of the conventional voltage amplification circuit.

FIG. 9 shows relations among inputs and outputs of the inverting amplifiers 11 and 12. In an upper right quadrant in FIG. 9, input and output characteristics of the inverting amplifier 11 placed in a first stage are shown. In an upper left quadrant in FIG. 9, input and output characteristics of the inverting amplifier 12 placed in a second stage are shown. In the inverting amplifier 11 placed in the first stage, the input voltage V1 obtained by superimposing the AC component contained in the input signal Vin is amplified with the clamping voltage Vc being used as a center voltage level and then the amplified voltage is output as an output voltage V2. The inverting amplifier 12 placed in the second stage receives the input voltage V2, amplifies it and outputs the amplified voltage as an output voltage Vout from the signal output terminal 2.

Here a range where a specified voltage amplification factor to an input voltage is provided and an output voltage is output is called an amplification operating range (shown by "A" in FIG. 9). In the configuration described above, in order for the conventional voltage amplification circuit to provide an excellent characteristic, the clamping voltage Vc serving as an input biasing voltage employed in the first stage is set as a center voltage level in the amplification operating range A of the inverting amplifier 11. This enables the inverting amplifier 11 placed in the first stage to faithfully amplify the input signal Vin and to output voltages each having a same waveform. However, in the inverting amplifier 12 placed in the second stage, since the input signal V2 contains a voltage exceeding a range of an input voltage in the amplification operating range, it is impossible to amplify part of the input signal V2 whose voltage has exceeded the above range, causing the input signal "V2" to have almost a constant output voltage and, therefore, it becomes impossible for the inverting amplifier 12 to faithfully produce an amplified signal so as to have the same waveform as the input signal V2.

To solve this problem, another conventional voltage amplification circuit is disclosed in the Japanese Patent Application Laid-open No. Hei 07-162760 (Japanese Patent No.2586393) in which a clamping voltage fed from a clamping circuit to an input terminal for a second inverting amplifier and obtained by inserting a clamping capacitor between first and second inverting amplifiers is set as a center voltage level in an amplification operating range in the second inverting amplifier. However, this method cannot be applied to a voltage amplification circuit constructed by DC-coupling inverting amplifies.

As described above, the conventional amplifier constructed by DC-coupling inverting amplifiers has a problem in that a inverting amplifier placed in a second stage cannot amplify faithfully an input signal. This problem becomes serious in the case of an amplifier providing a high amplification factor, which makes it difficult to obtain a voltage amplification circuit that can provide a high amplification factor.

SUMMARY OF THE INVENTION

In view of the above, it is an object of the present invention to provide a voltage amplification circuit which is capable of operating in a stable manner and of providing a high amplification factor.

According to a first aspect of the present invention, there is provided a voltage amplification circuit including:

a first inverting amplifier placed in a first stage;

a second inverting amplifier placed in a second stage, the second inverting amplifier being DC-coupled to the first inverting amplifier; and wherein an amplifying operation starting input voltage in the first inverting amplifier is set to be lower than an amplifying operation starting input voltage in the second inverting amplifier.

In the foregoing, a preferable mode is one that wherein further includes a clamping circuit to feed a clamping voltage to an input terminal for the first inverting amplifier and wherein a transistor placed on a load side making up the clamping circuit has substantially a same threshold value as a driver transistor in the second inverting amplifier.

According to a second aspect of the present invention, there is provided a voltage amplification circuit including:

a first inverting amplifier placed in a first stage;

a second inverting amplifier placed in a second stage, the second inverting amplifier being DC-coupled to the first inverting amplifier;

wherein the first inverting amplifier includes a first transistor with a drain and a gate of which are both connected to a terminal for a first potential and a second transistor with a gate of which is connected to an input node and with a source of which is connected to a terminal for a second potential, in which a source of the first transistor is connected to a drain of the second transistor, an output of the first inverting amplifier being placed between the source of the first transistor and the drain of the second transistor;

wherein a second inverting amplifier includes a third transistor with a drain and gate of which is connected to a terminal for the first potential and a fourth transistor with a gate of which is connected to a terminal for an output from the first inverting amplifier and with a source of which is connected to a terminal for the second potential, in which a source of the third transistor is connected to a drain of the fourth transistor, an output of the second inverting amplifier being placed between the source of the third transistor and the drain of the fourth transistor; and wherein a threshold value of the fourth transistor is larger than a threshold value of the second transistor.

In the foregoing, a preferable mode is one that wherein further includes a clamping circuit to output a clamping voltage to a clamping node which has sixth and eighth transistors with drains and gates of which are connected commonly to a terminal for the first potential and seventh and ninth transistors with drains and gates of which are connected to sources of the sixth and eighth transistors and with sources of which are connected commonly to a terminal for the second potential and wherein the sources of the sixth and eighth transistors and the gates and drains of the seventh and ninth transistors are connected to the clamp node and wherein the clamping circuit further has a fifth transistor with a gate of which is connected to a control signal terminal and with a drain or with a source of which is connected to an input node of the first inverting amplifier and with a source or with a drain of which is connected to the clamping node and wherein threshold values of the fourth and eighth transistors are substantially same.

Also, a preferable mode is one wherein a non-inverting amplifier is added which has a tenth transistor with a drain of which is connected to a terminal for the first potential and with a gate of which is connected to an output terminal for the second inverting amplifier and an eleventh transistor with a gate of which is connected to an output terminal for the first inverting amplifier and with a source of which is connected to a terminal for the second potential and wherein a source of the tenth transistor is connected to a drain of the eleventh transistor and a voltage is output therefrom.

Furthermore, a preferable mode is one wherein a transistor for controlling supply of a source voltage is connected to a connecting point to a terminal for the first potential wherein, while a control signal is active, the first potential is applied to the clamping circuit and while the control signal is inactive, the first potential is applied to an amplifying section.

With the above configurations, since inverting amplifiers are DC-coupled to one another and the amplifying operation starting input voltage in the inverting amplifier placed in the first stage is set to be lower than that in the inverting amplifier placed in the second stage, it is made possible to realize the voltage amplification circuit that can operate in a stable manner and can provide a large amplification factor.

With another configuration as above, since the circuit used to set the clamping voltage has substantially the same configurations as the circuit used to set the amplifying operation starting input voltage in the inverting amplifier placed in the second stage, it is made possible to realize the voltage amplification circuit that can follow variations in parameters on manufacturing to perform smooth operations and can provide a wide operating margin and a large amplification factor and can operate in a stable manner even though variations in parameters on manufacturing or even though variations in the source voltage being used occur.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
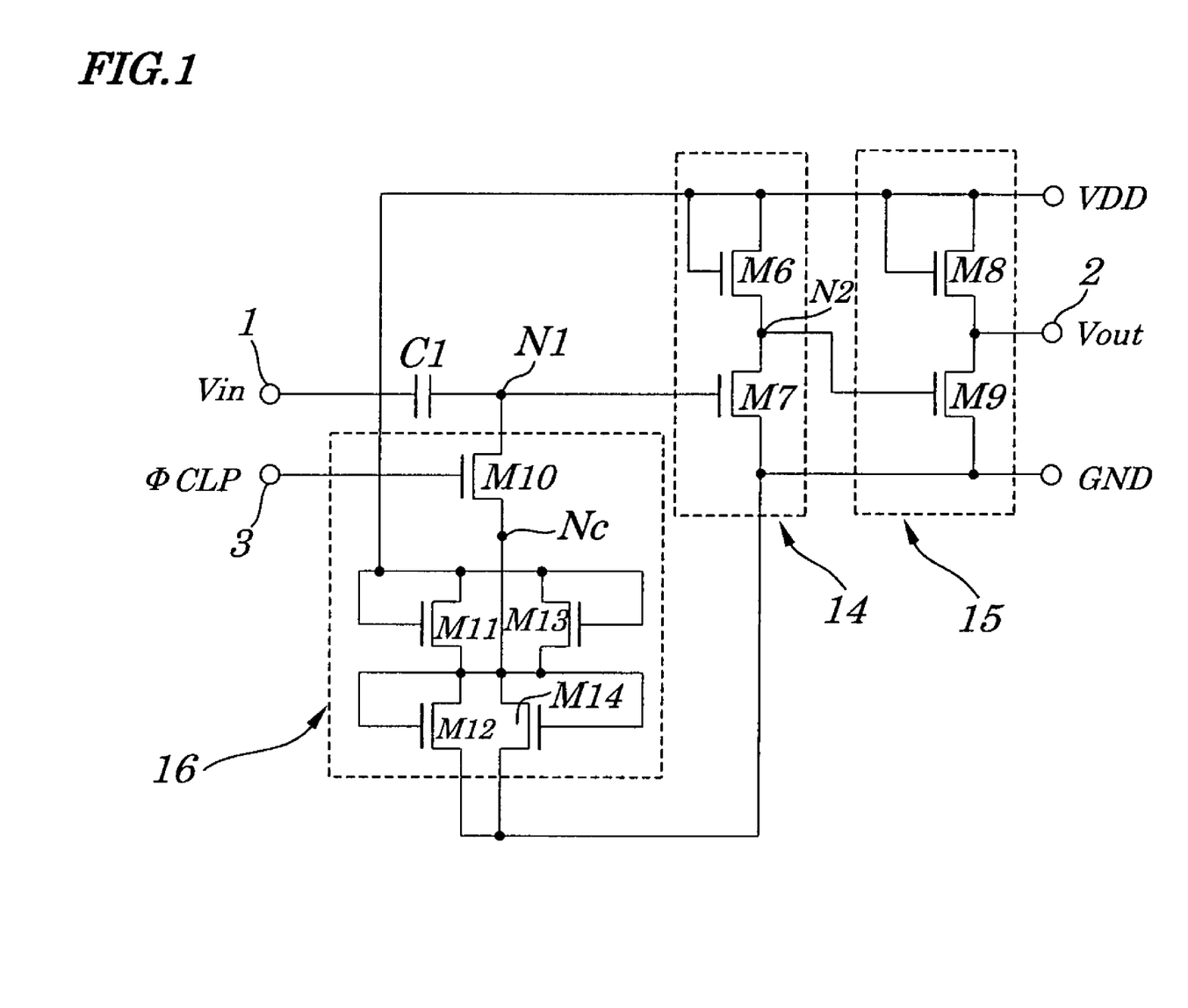
FIG. 1 is a circuit diagram showing configurations of a voltage amplification circuit according to a first embodiment of the present invention.

FIG. 1 is a circuit diagram showing configurations of a voltage amplification circuit according to a first embodiment of the present invention. The voltage amplification circuit of the embodiment includes a clamping capacitor C1, an amplifying section made up of an inverting amplifier 14 placed at a first stage and an inverting amplifier 15 placed at a second stage, and a clamping circuit 16.

In the clamping capacitor C1, one end of which is connected to a signal input terminal 1, and another end of which is connected to an input node N1, that is, an input terminal of the inverting amplifier 14 and an output terminal of the clamping circuit 16. The inverting amplifier 14 placed in a first stage is made up of transistors M6 an M7. A source of the driver transistor M7 which inverts a signal is connected to a ground terminal GND and its gate is connected to the input node N1 and its drain is connected to a source of the transistor M6. A gate and a drain of the transistor M6 are connected to a terminal for a source voltage VDD and its source is connected to an output node N2 to which the drain of the transistor M7 is commonly connected. A voltage V2 amplified by the inverting amplifier 14 is output from the output node N2.

The inverting amplifier 15 placed in a second stage is made up of transistors M8 and M9. A source of the driver transistor M9 which inverts a signal is connected to the ground terminal GND and its gate is connected to the output node N2 of the inverting amplifier 14 and its drain is connected to a source of the transistor M8. A gate and a drain of the transistor M8 are connected to a terminal for the source voltage VDD and its source is connected to a signal output terminal 2 to which the drain of the transistor M9 is commonly connected. An output voltage Vout amplified by the inverting amplifier 15 is output from the signal output terminal 2.

The clamping circuit 16 has a switching transistor M10 and a constant voltage generating section made up of transistors M11 to M14. A gate and a drain of the transistor M11 placed on a load side in the constant voltage generating section are connected to the terminal for the source voltage VDD and its source is connected to a gate and a drain of the transistor M12. A source of the transistor M12 is connected to the ground terminal GND. A gate and a drain of the transistor M13 placed on a load side in the constant voltage generating section are connected to the terminal for the source voltage VDD and its source is connected to a gate and a drain of the transistor M14. A source of the transistor M14 is connected to the ground terminal GND. The sources of the transistors M11 and M13 and the gates and drains of the transistors M12 and M14 are all connected commonly to a clamping node Nc from which a clamping voltage Vc serving as a constant voltage is output. A gate of the switching transistor M10 is connected to a control signal terminal 3 and one terminal serving as a source or a drain of the switching transistor M10 is connected to the clamping node Nc and another terminal serving as the drain or the source of the switching transistor M10 is connected to the input node N1. The clamping voltage Vc is fed from the switching transistor M10 to the input node N1.

In FIG. 1, Vin is an input signal to be fed to the signal input terminal 1 and the clamping capacitor C1 blocks a DC component contained in the input signal Vin and transfers only an AC component contained in the input signal Vin to the input terminal of the inverting amplifier 14. To the input node N1 of the inverting amplifier 14 is input a voltage V2 obtained by superimposing a clamping voltage on the AC component contained in the input signal Vin, where the input voltage is amplified and is output as an output voltage V2 to the output node N2. The inverting amplifier 15 amplifies the voltage V2 fed from the inverting amplifier 14 and outputs the amplified voltage as an output signal Vout to the signal output terminal 2.

The clamping circuit 16, when the switching transistor M10 is turned ON or OFF by a control signal φ CLP fed to the control signal terminal 3, outputs a clamping voltage Vc serving as a constant voltage to the input node N1. While the control signal φ CLP is active, the switching transistor M10 is turned ON, which causes the clamping voltage Vc to be fed to the input node N1 for DC biasing. While the control signal φ CLP is inactive, the switching transistor M10 is turned OFF and the input signal Vin is input to the input node N1 to initiate amplifying operations. The control signal φ CLP is a control signal which is made active at specified intervals.

The transistor M7 in the inverting amplifier 14 has a first transistor characteristic, whereas both the transistor M9 in the inverting amplifier 15 and transistor M13 in the clamping circuit 16 have a second transistor characteristic. Among the transistor characteristics in the first embodiment, the most important characteristic is regarded as a threshold voltage and the second most important characteristic is regarded as a gate length. Other characteristics of the transistor may be set to be arbitrary values. In the embodiment, a threshold voltage of the transistor M7 is set to be smaller than threshold voltages of the transistors M9 and M13. That is, the transistor M7 in the inverting amplifier 14 has a threshold voltage of Vt1 and both the transistor M9 in the inverting amplifier 15 and the transistor M13 in the clamping circuit 16 have a threshold voltage of Vt2 being larger than the threshold voltage Vt1. More preferably, a gate length of the transistor M9 in the inverting amplifier 15 is equal to that of the transistor M13 in the clamping circuit 16. Moreover, a gate width or a like of each of the transistors other than described above can be determined based on an amplification factor or a like of amplifiers employed in the embodiment.

Figure 2:
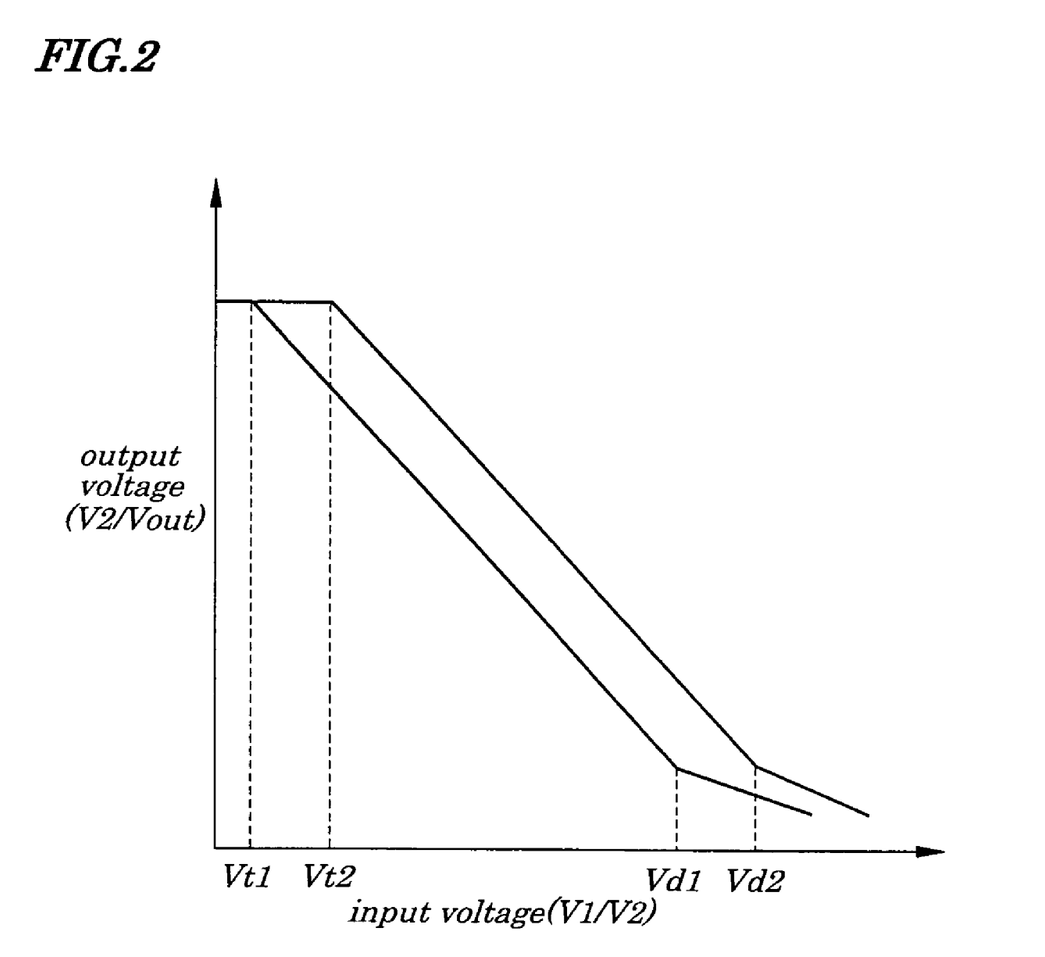
FIG. 2 is a diagram illustrating input and output characteristics in each of inverting amplifiers employed in the voltage amplification circuit of the first embodiment of the present invention.
Figure 3:
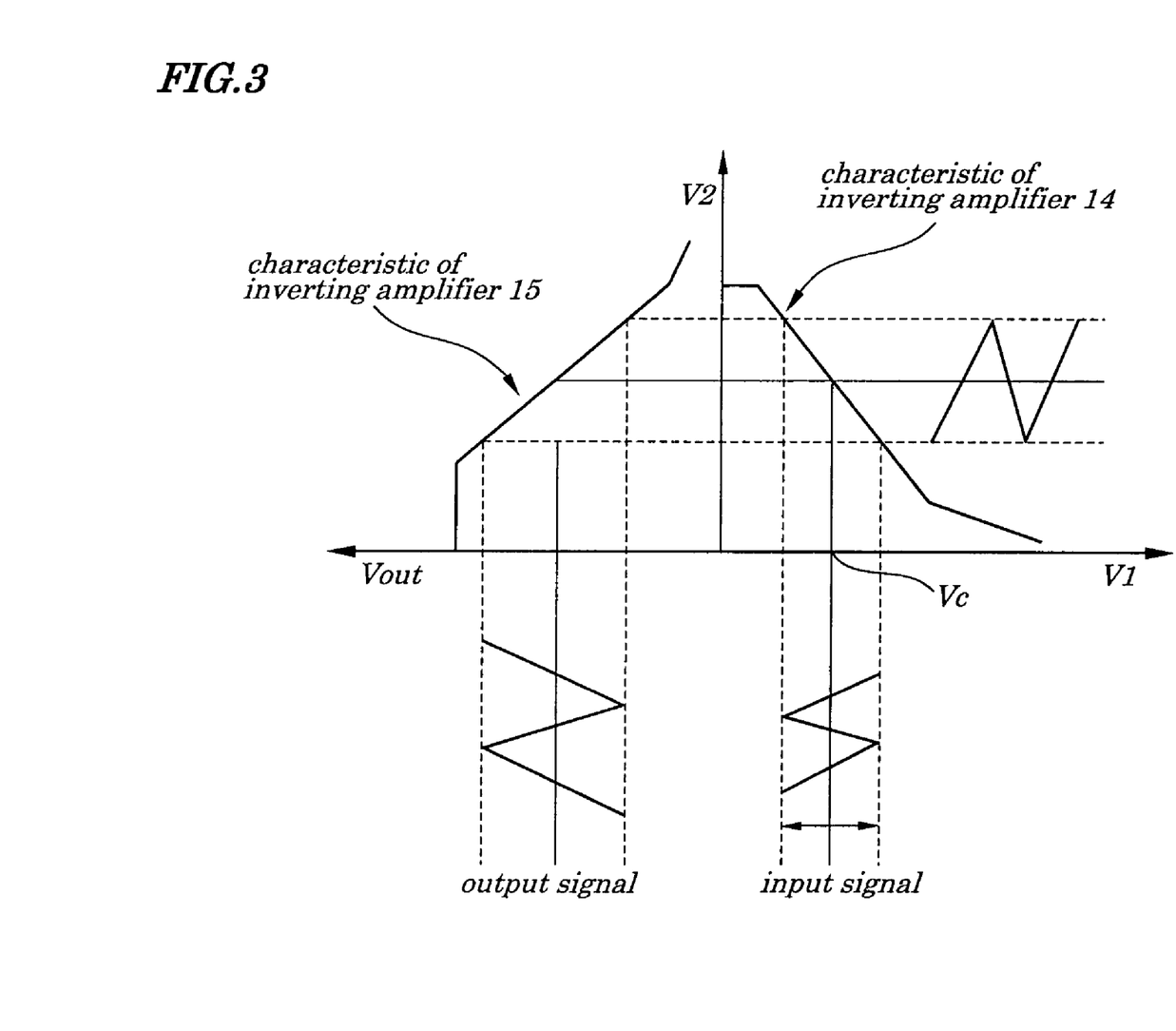
FIG. 3 is a diagram illustrating input and output characteristics of each of inverting amplifiers, both being DC-coupled to one another in the first embodiment of the present invention.
Figure 4:
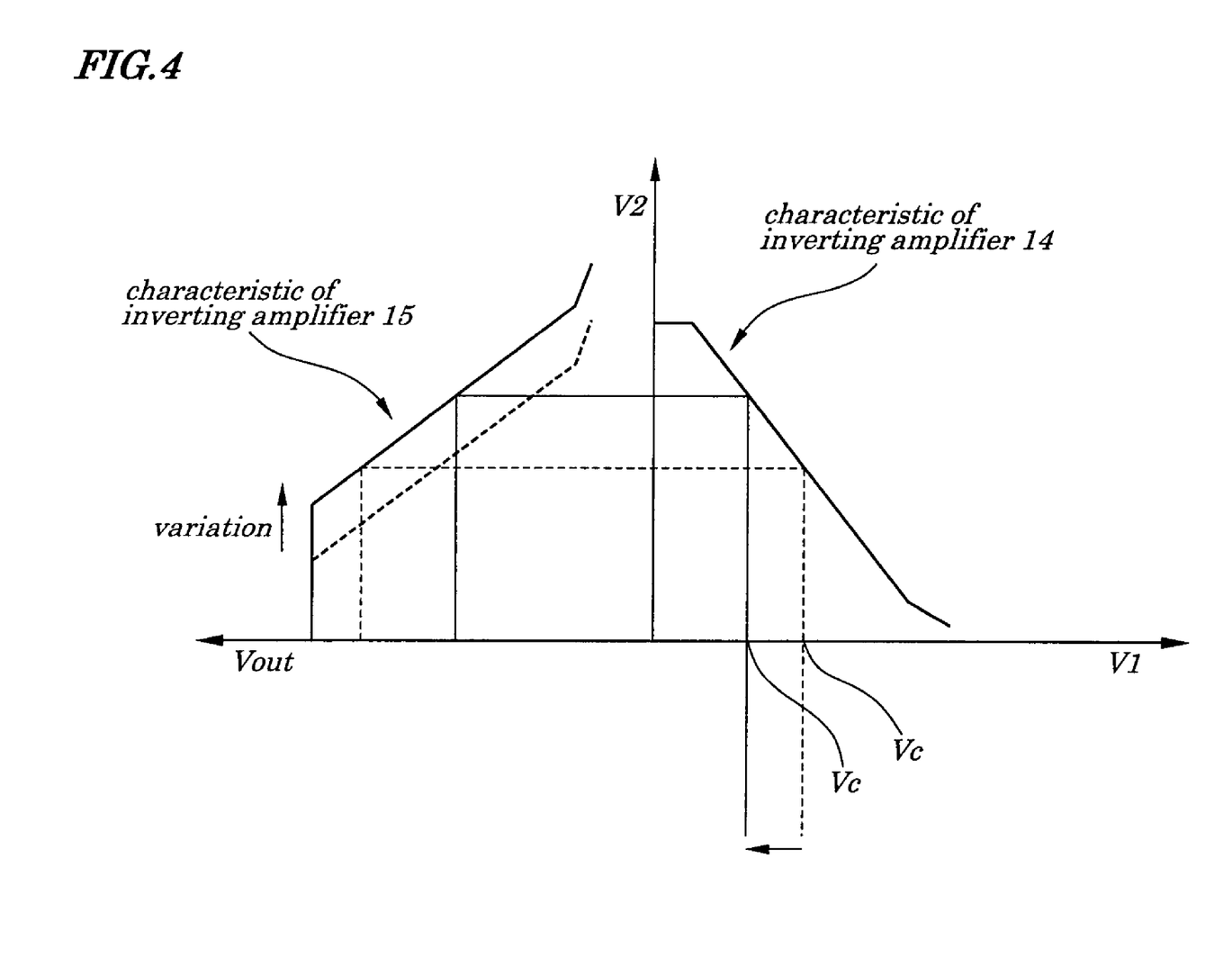
FIG. 4 is a diagram explaining a case where a threshold voltage of a transistor in the inverting amplifier has varied in the first embodiment of the present invention.

Operations of the voltage amplification circuit shown in FIG. 1 are described by referring to FIGS. 2, 3, and 4. FIG. 2 is a diagram illustrating input and output characteristics in each of the inverting amplifiers 14 and 15 employed in the voltage amplification circuit of the first embodiment. FIG. 3 is a diagram illustrating input and output characteristics of each of the inverting amplifiers 14 and 15 both being DC-coupled to each other in the first embodiment. FIG. 4 is a diagram explaining a case where a threshold voltage of the transistor M9 in the inverting amplifier 15 has varied in the input and output characteristics as shown in FIG. 3. It is now presumed that a voltage at the input node N1 being an input of the inverting amplifier 14 is represented as V1, a voltage at the output node N2 being an input of the inverting amplifier 15 as V2, a voltage at the signal output terminal 2 being an output of the inverting amplifier 15 as Vout, and the clamping voltage fed from the clamping circuit 16 as Vc.

Input and output characteristics of each of the inverting amplifiers 14 and 15 are explained by referring to FIG. 2. Also, presuming that a threshold voltage of the transistor M7 in the inverting amplifier 14 is represented as Vt1, until the input voltage V1 reaches Vt1, the transistor M7 is turned OFF and the inverting amplifier 14 outputs an output voltage V2 being a constant voltage. When the input voltage V1 exceeds the threshold voltage Vt1, the transistor M7 is put into an amplification operating range and amplifying operations begin. Here, the input voltage Vt1 is called an amplifying operation starting input voltage. When the input voltage further becomes larger and reaches Vd1, the transistor M7 is put into a triode operating range and an output voltage V2 becomes almost constant and no amplifying operations are performed. This input voltage Vd1 is called an amplification terminating input voltage. Therefore, the amplification operating range exists within a range of the input voltages (Vt1 to Vd1). Similarly, in the inverting amplifier 15, presuming that a threshold voltage of the transistor M9 is represented as Vt2, the amplification operating range exists in a range of the input voltages of Vt2 to Vd2. In this case, since Vt1<Vt2, the amplification operating range of the inverting amplifier 15 is shifted by a differential (Vt2−Vt1) toward a range having a larger input voltage range from the amplification operating range of the inverting amplifier 14.

Output and input characteristics of each of the inverting amplifiers 14 and 15 each having configurations shown in FIG. 1 and both being DC-coupled to each other are described by referring to FIG. 3. The output and input characteristic (plot) of the inverting amplifier 14 is shown in an upper right quadrant of FIG. 3 and the output and input characteristic (plot) of the inverting amplifier 15 is shown in an upper left quadrant of FIG. 3. In the inverting amplifier 14, a clamping voltage Vc is fed so that it is used as a center voltage level in the amplification operating range and an input voltage V1 obtained by superimposing an input signal voltage on the clamping voltage Vc and an amplified voltage V2 is transferred to the inverting amplifier 15. In the inverting amplifier 15, since the amplifying operation starting input voltage Vt2 is set to be higher than the amplifying operation starting input voltage Vt1 of the inverting amplifier 14, even if the amplified voltage V2 having a large amplitude is input, the amplified voltage falls within an amplification operating range, thus enabling an input voltage to be faithfully amplified and to be output.

FIG. 4 shows input and output characteristics in a case where a threshold voltage, shown in FIG. 3, of the driver transistor M9 in the inverting amplifier 15 and of the transistor M13 placed on a load side in the clamping circuit 16 has varied to a higher voltage level due to variations in parameters on manufacturing being used at time of manufacturing semiconductors. Here, a case is explained in which a threshold voltage of the driver transistor M9 in the inverting amplifier 15 and of the transistor M13 placed on the load side in the clamping circuit 16, both having a same characteristic (threshold voltage in this case), has varied to a higher voltage level from Vt2 to Vt2'. When a threshold voltage of the driver transistor M9 in the inverting amplifier 15 becomes higher, the amplifying operation starting input voltage becomes high from Vt2 to Vt2' in a manner to correspond to the change in the threshold voltage of the driver transistor M9, which causes the amplification operating range to vary in a manner to correspond to an amount of variations in the amplifying operation starting input voltage.

In the clamping circuit 16, since a threshold voltage of the transistor M13 being used on a load side becomes larger, a set voltage of the clamping voltage lowers from Vc to Vc' in a manner to correspond to the differential (Vt2'−Vt2). The voltage amplification circuit of the embodiment operates so that, by lowering the clamping voltage to the level Vc', an output voltage from the inverting amplifier 14 is varied so that a higher voltage is output and by changing the amplifying operation starting input voltage and amplification operating range of the inverting amplifier 15 so that the higher input voltage can fall within the range of the amplifying operation starting input voltage and amplification operating range, the problem of influences caused by variations in the parameters on manufacturing can be prevented.

Thus, by making same the characteristics (here, threshold voltages) of the driver transistor M9 in the inverting amplifier 15 and of the transistor M13 placed on the load side in the clamping circuit 16, the influences caused by variations in parameters on manufacturing on the variations in the clamping voltage and in the amplification operating range in the inverting amplifier 15 can be cancelled and the clamping voltage is set as the center voltage level in the amplification operating range of the inverting amplifier 15, it is made possible to amplify an input voltage having an enough amplitude. In the case where the threshold voltage has varied to become lower, by configuring so that a clamping voltage from the clamping circuit 16 becomes higher, the inverting amplifier 14 outputs a lower voltage and the inverting amplifier 15 lowers the amplifying operation starting input voltage, influences caused by variations in the parameters on manufacturing can be cancelled and an input voltage can be faithfully amplified and be output.

Thus, in the voltage amplification circuit of the embodiment, the circuit to determine a clamping voltage output from the clamping circuit has substantially the same configurations as the circuit to determine the amplifying operation starting input voltage in the inverting amplifier. By configuring as above, an voltage amplification circuit can be realized which is able to vary a clamping voltage in a manner to follow variations in the amplifying operation starting input voltage to avoid influences caused by variations in parameters on manufacturing and is able to have a wide operating range and to operate in a stable manner. Moreover, since the voltage amplification circuit of the embodiment has a wide operating range and can provide stable operations, even when a source voltage is low, a wide operating margin can be obtained, thus enabling achievement of the voltage amplification circuit that can provide a large amplification factor even in low voltage environments.

Characteristics of the transistors M7, M9, and M13 employed in the embodiment are explained above, however, no special requirement is imposed on characteristics of the transistors other than described above. That is, transistors having, for example, a third characteristic may be used or setting may be done on transistors so that the transistor characteristic desired as in the embodiment can be obtained. However, when a chip size and a manufacturing process are taken into consideration, it is preferable that transistors having the first characteristic are used. Different threshold voltages being one of these characteristics can be obtained by making different a thickness of a gate insulating film, a condition for impurity implantation for controlling a threshold voltage being parameters on manufacturing or a like.

In the embodiment, the problem described above is solved by making threshold voltages of the transistors M9 and M13 be larger than the threshold voltage of the transistor M7. However, in the case of a circuit in which threshold voltages of the transistors M9 and M13 are made same to be Vt1 and a transistor on a side of a source of which a diode is connected to and having a threshold voltage of Vt1 is inserted, its threshold voltage becomes 2 Vt1. By using this circuit having such configurations, same effects as obtained by making a threshold voltage larger can be achieved. The present invention maybe applied to such a circuit configuration in which a threshold voltage can be set to be large, as well as a circuit configuration making up of the transistors M9 and M13.

As described above, in the voltage amplification circuit of the present invention, by DC-coupling inverting amplifiers 14, 15 and by setting an amplifying operation starting input voltage in the inverting amplifier 14 being placed in the first stage to be lower than that in the inverting amplifier 15 being placed in the second stage, stable amplifying operations can be performed. Also, by configuring the voltage amplification circuit so that the circuit used to set an amplifying operation starting input voltage has substantially the same configurations as a circuit used to set a clamping voltage, the amplifying operation starting input voltage can be varied in a manner to follow variations in the clamping voltage to avoid influences caused by variations in parameters on manufacturing. Moreover, by varying the clamping voltage in a manner to follow variations in the amplifying operation starting input voltage, the voltage amplification circuit can be realized which can operate in a stable manner against variations in parameters on manufacturing and in a source voltage being used; and can provide a large amplification factor.

Second Embodiment

Figure 5:
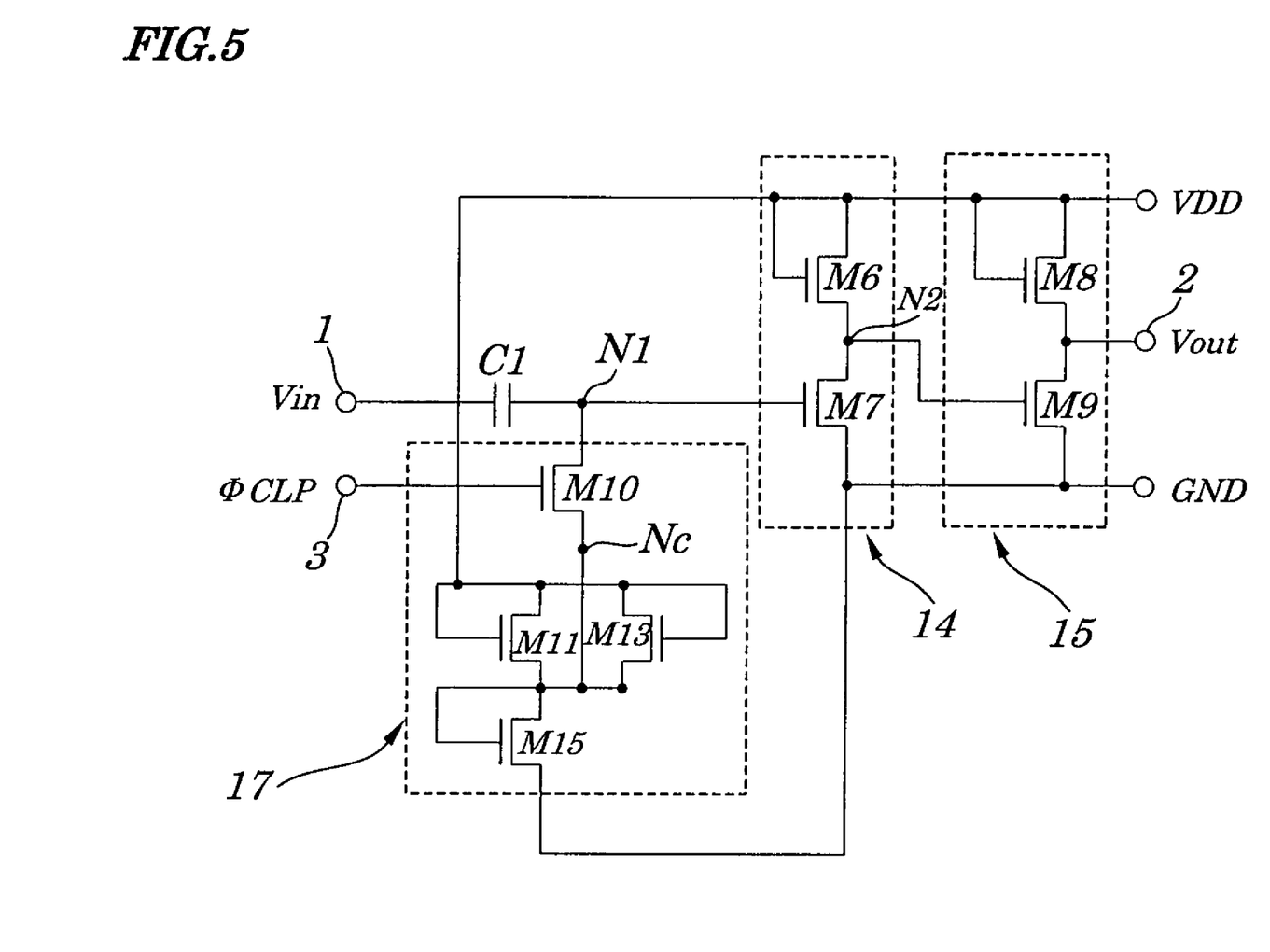
FIG. 5 is a circuit diagram showing configurations of a voltage amplification circuit according to a second embodiment of the present invention.

FIG. 5 is a circuit diagram showing configurations of a voltage amplification circuit according to a second embodiment of the present invention. In FIG. 5, same reference numbers are assigned to components having same functions as those in FIG. 1 and their descriptions are omitted accordingly. In the second embodiment, transistors M12 and M14 making up a clamping circuit 16 employed in the first embodiment are integrated into one transistor M15, which makes up a clamping circuit 17. Configurations of the voltage amplification circuit of the second embodiment differ from those in the first embodiment in that, since the transistors M12 and M14 making up the clamping circuit 16 in the first embodiment have the first characteristic, these transistors M12 and M14 are integrated into one transistor M15 having a size that can provide substantially the same effects as obtained in the first embodiment. As shown in FIG. 5, transistors M12 and M14, so long as they have the same characteristic, can be integrated into one transistor M15. For example, when the transistors M12 and M14 shown in FIG. 1 have a same threshold voltage and a same gate length L, as a gate width W of the transistor M15 shown in FIG. 5, a sum of gate widths of the transistors 12 and 14 shown in FIG. 1 can be used. Actually, the gate length L and the gate width W each having substantially the same characteristic can be calculated by using a circuit simulation such as SPICE (Simulation Program with Integrated Circuit Emphasis) or a like. Even by configuring as above, a voltage amplification circuit that can provide a stable operation and a large amplification factor can be obtained.

Third Embodiment

Figure 6:
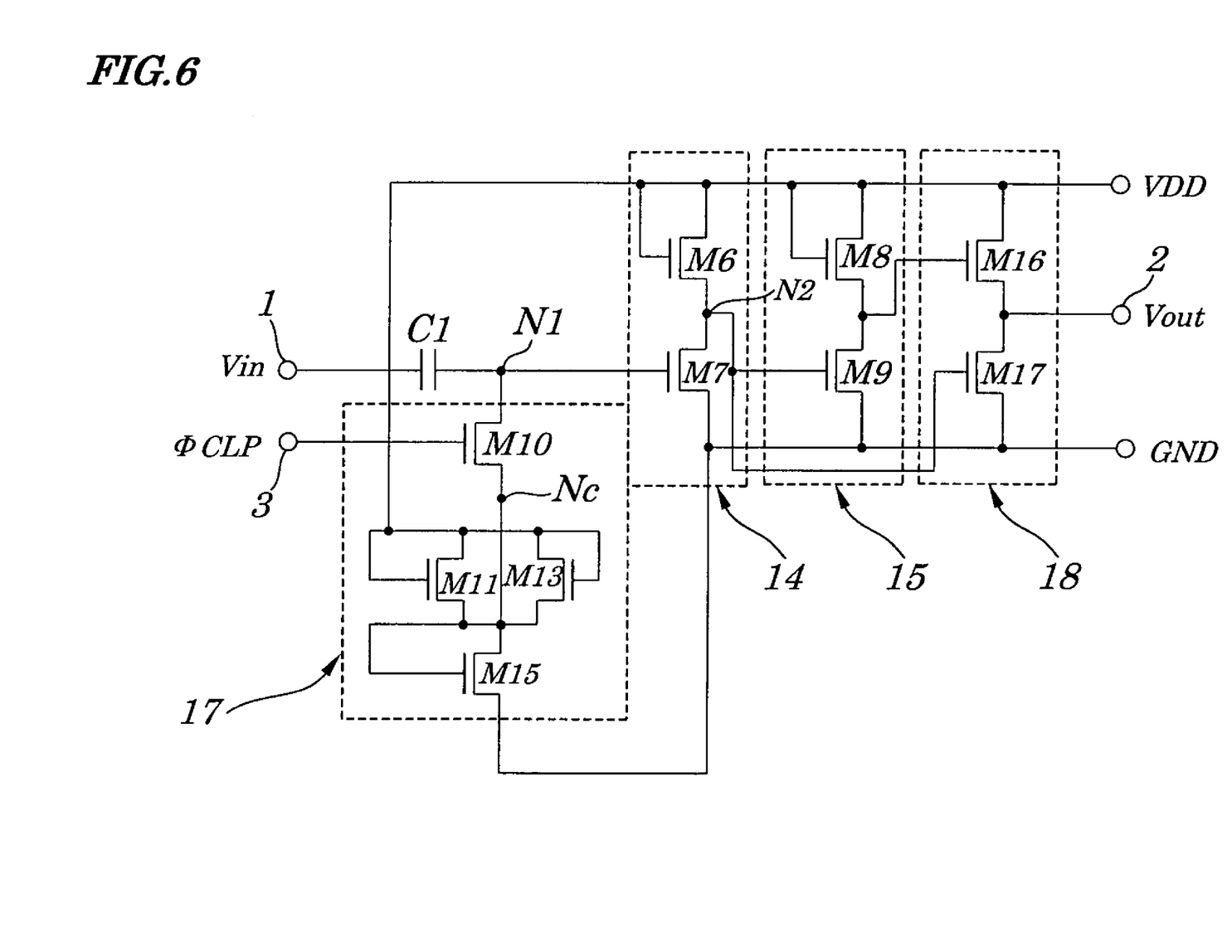
FIG. 6 is a circuit diagram showing configurations of a voltage amplification circuit according to a third embodiment of the present invention.

FIG. 6 is a circuit diagram showing configurations of a voltage amplification circuit according to a third embodiment of the present invention. In FIG. 6, same reference numbers are assigned to components having same functions as those in FIG. 5 and their descriptions are omitted accordingly. Configurations of the voltage amplification circuit of the third embodiment shown in FIG. 6 differ from those in the second embodiment shown in FIG. 5 in that a non-inverting amplifier 18 is further placed after inverting amplifiers 14 and 15 placed respectively in a first stage and a second stage. Therefore, the inverting amplifiers 14 and 15 and the non-inverting amplifier 18 make up an amplifying section. By adding the non-inverting amplifier 18, a high-speed amplifier that can provide a large amplification factor can be realized. The non-inverting amplifier 18 is made up of a transistor M16 having a first characteristic and of a transistor M17 having a second characteristic. A drain of the transistor M16 is connected to a terminal for a source voltage VDD, its gate is connected to an output node N3 of the inverting amplifier 15 and its source is connected to a drain of the transistor M17 and a signal is output therefrom. A gate of the transistor 17 is connected to an output node N2 of the inverting amplifier 14 being placed in the first stage and its source is connected to a GND terminal. The non-inverting amplifier 18 starts amplifying operations at a same input voltage as used in the inverting amplifier 15 placed in the second stage. The transistor M16 operates as a source follower and a gain of the non-inverting amplifier 18 is about 1.2 times to 1.5 times.

Fourth Embodiment

Figure 7:
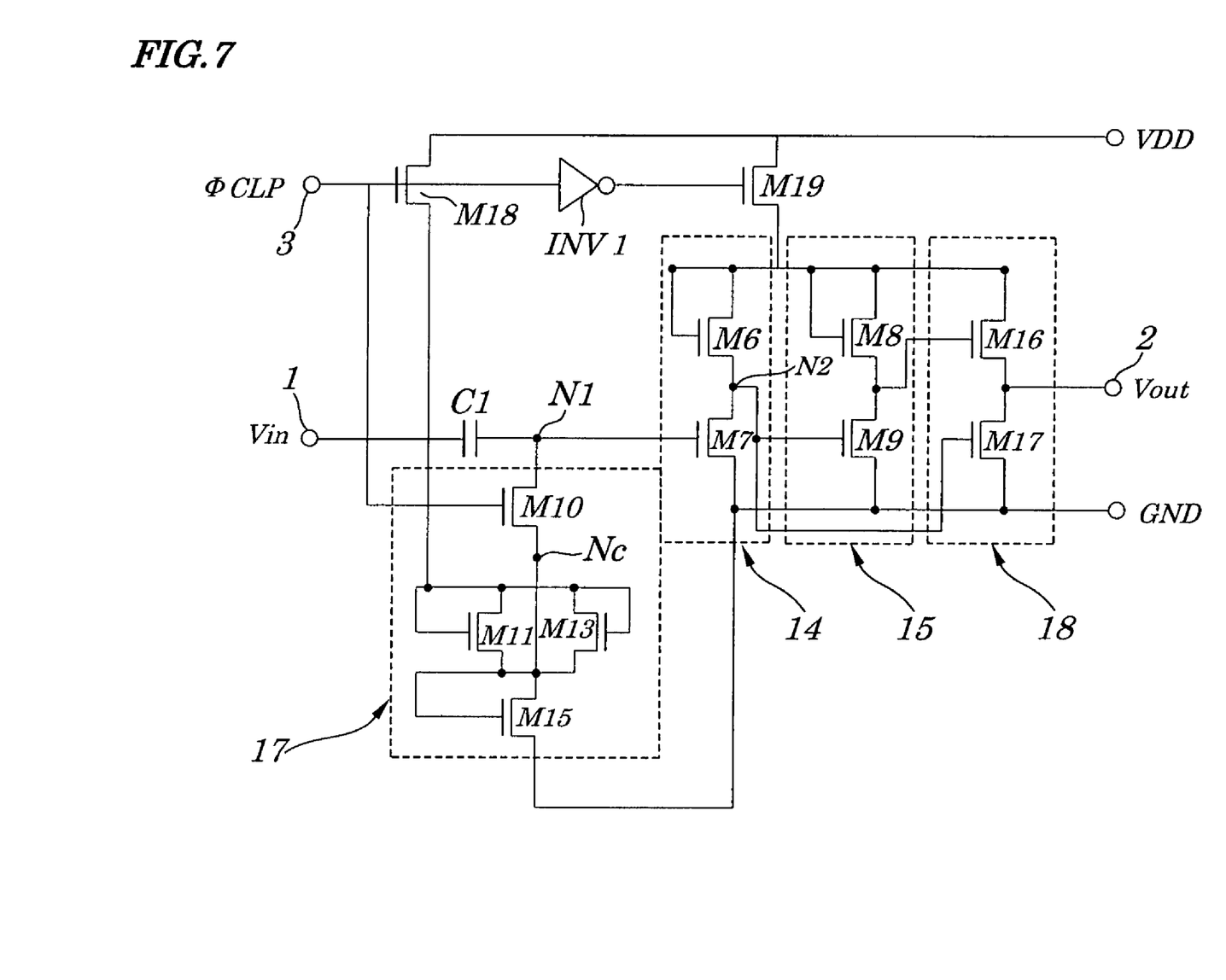
FIG. 7 is a circuit diagram showing configurations of a voltage amplification circuit according to a fourth embodiment of the present invention.

FIG. 7 is a circuit diagram showing configurations of a voltage amplification circuit according to a fourth embodiment of the present invention. In FIG. 7, same reference numbers are assigned to components having same functions as those in FIG. 6 and their descriptions are omitted accordingly. Configurations of the voltage amplification circuit of the fourth embodiment differ from those in the third embodiment shown in FIG. 6 in that a transistor M18 for controlling supply of a source voltage is connected between a clamping circuit 17 and a terminal for a source voltage VDD, and a transistor M19 for controlling supply of the source voltage is connected between the terminal for the source voltage VDD and each of inverting amplifiers 14 and 15 and the non-inverting amplifier 18. That is, the transistor M18 controls supply of the source voltage to the clamping circuit 17 and the transistor M19 controls supply of the source voltage to inverting amplifiers 14 and 15 and the non-inverting amplifier 18 all making up the amplifying section.

A drain of the transistor M18 is connected to the terminal for the source voltage VDD, its source is connected to a gate and a drain of each of transistors M11 and M13 in the clamping circuit 17. A drain of the transistor M19 is connected to the terminal for the source voltage VDD, its gate is connected to an output terminal of an inverter circuit INV1 connected to a control signal terminal 3, and its source is connected to a gate and a drain of each of transistors M6, M8, and M16. The inverter circuit INV1 inverts a control signal φ CLP input from the control signal terminal 3 and outputs the inverted signal.

The control signal φ CLP is a control signal which becomes active at specified intervals. While the control signal φ CLP is active, the transistor M18 is put into an ON state to cause a source voltage VDD to be fed to the clamping circuit 17 and the transistor M19 is in an OFF state to cause the source voltage VDD not to be fed to the amplifying section made up of the inverting amplifiers 14 and 15 and the non-inverting amplifier 18. While the control signal φ CLP is not active, the transistor M18 is in an OFF state to cause the source voltage VDD not to be fed to the clamping circuit 17 and the transistor M19 is put into an ON state to cause the source voltage VDD to be fed to the inverting amplifiers 14, 15, and the non-inverting amplifier 18 and to start amplifying operations.

By exerting control on the transistor for controlling supply of a source voltage, the source voltage is applied alternately to the clamping circuit and amplifying section, which enables reduction of current consumption and achievement of a voltage amplification circuit that can provide a large amplification factor and consumes less current. As shown in FIG. 7, the additional transistor for controlling supply of a source voltage is applied to the voltage amplification circuit employed in the fourth embodiment, however, it is needless to say that it can be also applied to the voltage amplification circuits employed in the first and second embodiments.

It is apparent that the present invention is not limited to the above embodiments but may be changed and modified without departing from the scope and spirit of the invention. For example, the present invention may be applied to all types of voltage amplification circuits which can follow variations in parameters on manufacturing by DC-coupling inverting amplifiers and by setting an amplifying operation starting input voltage in an inverting amplifier placed in a first stage so as to be lower than that in an inverting amplifier placed in a second stage and by configuring the voltage amplification circuit so that its circuit used to set a clamping voltage has substantially the same configurations as its circuit used to set an amplifying operation starting input voltage in an inverting amplifier to be placed in a subsequent stage.

What is claimed is:

1. A voltage amplification circuit comprising:
a first inverting amplifier placed in a first stage;
a second inverting amplifier placed in a second stage, said second inverting amplifier being DC-coupled to said first inverting amplifier; and a clamping circuit to feed a clamping voltage to an input terminal for said first inverting amplifier and wherein a transistor placed on a load side making up said clamping circuit has substantially a same threshold value as a driver transistor in said second inverting amplifier, wherein an amplifying operation starting input voltage in said first inverting amplifier is set to be lower than an amplifying operation starting input voltage in said second inverting amplifier.

2. A voltage amplification circuit comprising:
a first inverting amplifier placed in a first stage;
a second inverting amplifier placed ma second stage, said second inverting amplifier being DC-coupled to said first inverting amplifier;
wherein said first inverting amplifier comprises a first transistor with a drain and a gate of which are both connected to a terminal for a first potential and a second transistor with a gate of which is connected to an input node and with a source of which is connected to a terminal for a second potential, in which a source of said first transistor is connected to a drain of said second transistor, an output of said first inverting amplifier being placed between said source of said first transistor and said drain of said second transistor;
wherein a second inverting amplifier comprises a third transistor with a drain and gate of which is connected to a terminal for said first potential and a fourth transistor with a gate of which is connected to a terminal for an output from said first inverting amplifier and with a source of which is connected to a terminal for said second potential, in which a source of said third transistor is connected to a drain of said fourth transistor, an output of said second inverting amplifier being placed between said source of said third transistor and said drain of said fourth transistor; and
wherein a threshold value of said fourth transistor is larger than a threshold value of said second transistor.

3. The voltage amplification circuit according to claim 2, further comprising a clamping circuit to output a clamping voltage to a clamping node which has sixth and eighth transistors with drains and gates of which are connected commonly to a terminal or said first potential and seventh and ninth transistors with drains and gates of which are connected to sources of said sixth and eighth transistors and with sources of which are connected commonly to a terminal for said second potential and wherein said sources of said sixth and eighth transistors and said gates and said drains of said seventh and ninth transistors are connected to said clamp node and wherein said clamping circuit further has a fifth transistor with a gate of which is connected to a control signal terminal and with a drain or with a source of which is connected to an input node of said first inverting amplifier and with a source or with a drain of which is connected to said clamping node and wherein threshold values of said fourth and eighth transistors are substantially same.

4. The voltage amplification circuit according to claim 2, wherein a non-inverting amplifier is added which has a tenth transistor with a drain of which is connected to a terminal for said first potential and with a gate of which is connected to an output terminal for said second inverting amplifier and an eleventh transistor with a gate of which is connected to an output terminal for said first inverting amplifier and with a source of which is connected to a terminal for said second potential and wherein a source of said tenth transistor is connected to a drain of said eleventh transistor and a voltage is output therefrom.

5. The voltage amplification circuit according to claim 3, wherein a transistor for controlling supply of a source voltage is connected to a connecting point to a terminal for said first potential wherein, while a control signal is active, said first potential is applied to said clamping circuit and while said control signal is inactive, said first potential is applied to an amplifying section.

6. The voltage amplification circuit according to claim 3, wherein a non-inverting amplifier is added which has a tenth transistor with a drain of which is connected to a terminal for said first potential and with a gate of which is connected to an output terminal for said second inverting amplifier and an eleventh transistor with a gate of which is connected to an output terminal for said first inverting amplifier and with a source of which is connected to a terminal for said second potential and wherein a source of said tenth transistor is connected to a drain of said eleventh transistor and a voltage is output therefrom.

7. The voltage amplification circuit according to claim 3, wherein a transistor for controlling supply of a source voltage is connected to a connecting point to a terminal for said first potential wherein, while a control signal is active, said first potential is applied to said clamping circuit and while said control signal is inactive, said first potential is applied to an amplifying section.

8. The voltage amplification circuit according to claim 4, wherein a transistor for controlling supply of a source voltage is connected to a connecting point to a terminal for said first potential wherein, while a control signal is active, said first potential is applied to said clamping circuit and while said control signal is inactive, said first potential is applied to an amplifying section.

* * * * *